(12) United States Patent
Braunstorfinger

(10) Patent No.: US 9,454,510 B2
(45) Date of Patent: Sep. 27, 2016

(54) MEASURING DEVICE, A CALIBRATION DEVICE, A MEASURING SYSTEM AND A METHOD WITH A DYNAMIC DATA SHEET

(71) Applicant: Rohde & Schwarz GmbH & Co. KG, Munich (DE)

(72) Inventor: Thomas Braunstorfinger, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 776 days.

(21) Appl. No.: 13/871,677

(22) Filed: Apr. 26, 2013

(65) Prior Publication Data

US 2013/0289920 A1 Oct. 31, 2013

(30) Foreign Application Priority Data

Apr. 27, 2012 (DE) .................. 10 2012 207 021

(51) Int. Cl.
*G01F 25/00* (2006.01)
*G01R 11/32* (2006.01)
*G01R 1/02* (2006.01)
*G06F 17/00* (2006.01)
*G01R 35/00* (2006.01)
*G01D 18/00* (2006.01)

(52) U.S. Cl.
CPC ............. *G06F 17/00* (2013.01); *G01D 18/008* (2013.01); *G01R 35/005* (2013.01); *G01R 35/007* (2013.01)

(58) Field of Classification Search
CPC .. G01R 35/005; G01R 35/007; G01R 27/04; G01R 27/32; G06F 17/00; G01D 18/008
USPC ...................... 702/85, 104; 324/74, 130, 601
See application file for complete search history.

(56) References Cited

U.S. PATENT DOCUMENTS

| | | | |
|---|---|---|---|
| 3,990,004 A | 11/1976 | Newton | |
| 5,248,933 A | 9/1993 | Venditti | |
| 8,319,502 B2 * | 11/2012 | Hashimshony | G01R 35/007 324/601 |
| 2004/0164752 A1 | 8/2004 | Crook et al. | |
| 2008/0161957 A1 | 7/2008 | Rice et al. | |
| 2010/0281412 A1 | 11/2010 | Cataldo et al. | |

FOREIGN PATENT DOCUMENTS

| | | |
|---|---|---|
| DE | 26 35 204 A1 | 3/1977 |
| DE | 103 50 859 A1 | 9/2004 |

* cited by examiner

*Primary Examiner* — An Do
(74) *Attorney, Agent, or Firm* — Ditthavong & Steiner, P.C.

(57) ABSTRACT

A measuring device including a signal-processing device, a processor for controlling the measuring device and a communications device. The signal-processing device and the communications device are each connected to the processor. The measuring device further includes a calibration-parameter store connected to the processor for the storage of calibration parameters. The processor is configured to communicate calibration parameters, which are stored in the calibration-parameter store, to a calibration device using the communications device and to implement calibration measurements using the signal-processing device.

14 Claims, 5 Drawing Sheets

MEASURING DEVICE, A CALIBRATION DEVICE, A MEASURING SYSTEM AND A METHOD WITH A DYNAMIC DATA SHEET

FIELD OF THE INVENTION

The invention relates to a measuring device, a calibration device, a measuring system and a method for operating the calibration system, which use a dynamically generated data sheet.

BACKGROUND OF THE INVENTION

Measuring devices are conventionally supplied with a manual printed on paper. The manual specifies calibration parameters which are checked during a calibration measurement. Accordingly, these calibration values are used within the framework of the calibration for checking continued functional capability and observance of the set properties for the measuring device specified in the data sheet. However, during the production life-cycle of a measuring device, such calibration parameters can change. This can occur, on the one hand, if the performance capability of the measuring device changes because of new device software, but also if components of the measuring device are replaced. In such cases, it may become necessary to modify the calibration parameters applicable for a measuring device especially at the time of a service. Such modifications are not usually reproduced reliably in an updated manual. The data sheet is also not updated in such a reliable manner that purchasers of the measuring device always have current calibration parameters for the measuring device at their disposal. Even if such an update takes place, it cannot be guaranteed that the customer has the appropriate documents to hand in the event of a customer-implemented calibration.

For example, DE 26 35 204 B2 shows a conventional network analyser which is supplied with a data sheet and a service manual. The above-named problems can therefore occur with this measuring device.

The invention is based upon the object of providing a measuring device, a calibration device, a measuring system and a method for operating a calibration system which guarantee the use of updated calibration parameters with a low cost to the user.

SUMMARY OF THE INVENTION

A measuring device according to the invention comprises a signal-processing device, a processor for controlling the measuring device and a communications device. The signal-processing device and the communications device in this context are each connected to the processor. The measuring device further comprises a calibration-parameter store connected to the processor for the storage of calibration parameters. In this context, the processor is embodied to communicate parameters which are stored in the calibration-parameter store by means of the communications device to a calibration device, and to implement calibration measurements on the basis of the signal-processing device. Accordingly, it is possible always to have currently updated parameters available for the calibration.

By preference, the measuring device is embodied to be connected to the calibration device by means of the signal-processing device and by means of the communications device. In this manner, the calibration parameters can be transmitted simply.

The processor is preferably embodied to transmit results of calibration measurements to the calibration device by means of the communications device. In this manner, a large number of measuring devices can be calibrated.

The communications device is preferably embodied to communicate with the calibration device by means of a standardised protocol, preferably SCPI. The measuring device is then embodied to be controlled by the calibration device by means of the standardised protocol. In this manner, the calibration can be carried out very efficiently without user intervention.

The measuring device is preferably embodied to generate the calibration parameters automatically on the basis of device hardware, device software and/or device firmware. In this manner, further user expenditure can be saved.

A calibration device according to the invention comprises a signal-processing device, a communications device, a processor for controlling the calibration device and a DUT store. In this context, the DUT store, the signal-processing device and the communications device are connected to the processor. The processor is embodied to receive calibration parameters from a measuring device to be calibrated by means of the communications device and to store them in the DUT store, and, by means of the signal-processing device, to implement calibration measurements in the measuring device on the basis of the calibration parameters. Accordingly, accurate calibrations can be implemented on the basis of current calibration parameters.

The processor is preferably embodied to implement calibration measurements on the measuring device on the basis of the calibration parameters, and/or to receive results from calibration measurements which have been implemented by the measuring device to be calibrated, by means of the communications device. In this manner, a number of different measuring devices can be calibrated with minimal cost.

The processor is preferably embodied to implement a comparison of results of the calibration measurements with the calibration parameters, and, on the basis of the comparison, to determine a capability of the measuring device to be calibrated. It is therefore possible to determine automatically and with minimal costs whether the measuring device fulfils given requirements.

The communications device is preferably embodied to communicate with the measuring device to be calibrated by means of a standardised protocol, preferably SCPI. The processor is then embodied to control the measuring device to be calibrated by means of the communications device by means of the standardised protocol. In this manner, the calibration can be implemented with minimal cost to the user.

A measuring system according to the invention contains a previously described measuring device and a previously described calibration device. A very simple and accurate calibration is accordingly possible.

A method according to the invention for operating a measuring system with a measuring device and a calibration device provides the following steps:

- Reading, by the calibration device from a calibration-parameter store of the measuring device, of calibration parameters of the measuring device;
- Implementation of calibration measurements on the basis of the calibration parameters read by the measuring device and/or the calibration device;
- Determination of the capability of the measuring device on the basis of a comparison of results of the calibration measurements and the calibration parameters. In this manner, a simple and accurate calibration is possible.

By preference, further steps are implemented before reading the calibration parameters:
Determination of calibration parameters;
Transmission of calibration parameters to the measuring device, and
Storage of the calibration parameters by the measuring device. Accordingly, a provision of accurate, updated calibration parameters is possible.

BRIEF DESCRIPTION OF THE DRAWINGS

The invention is described by way of example below with reference to the drawings in which an advantageous exemplary embodiment of the invention is illustrated. The drawings show.

DETAILED DESCRIPTION OF THE DRAWINGS

Initially, the general structure and function of the calibration system according to the invention will be explained with reference to FIG. 1. Following this, the structure and function of the measuring device according to the invention will be presented with reference to FIG. 2. With reference to FIG. 3, the structure and function of the calibration device according to the invention will then be explained. Finally, with reference to FIGS. 4 and 5, the function of an exemplary embodiment of the method according to the invention will be described.

Figure 1:
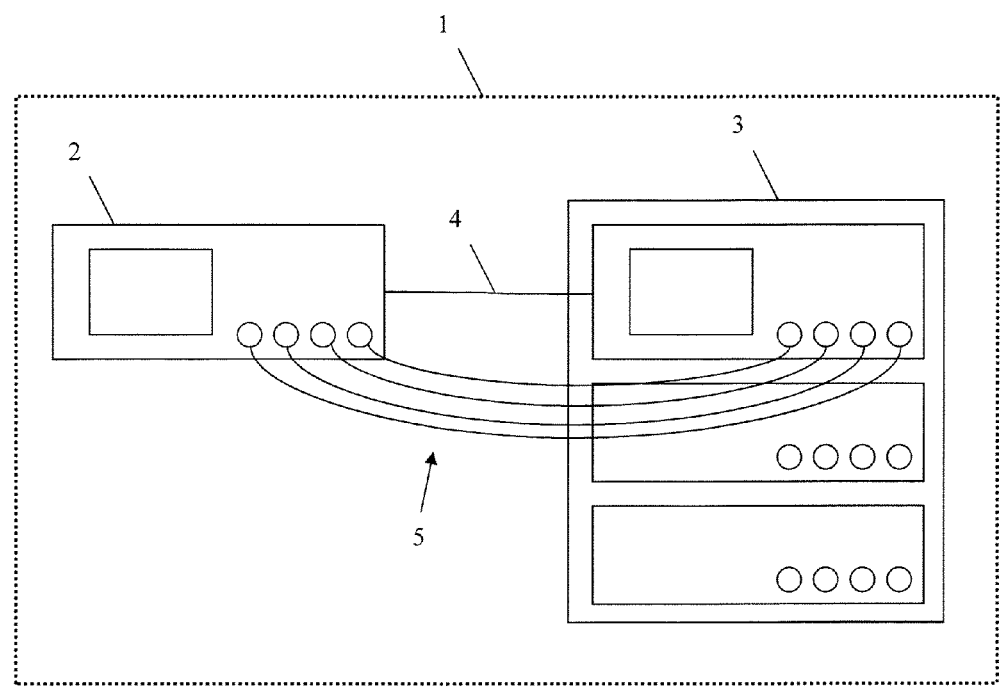
FIG. 1 an exemplary embodiment of the calibration system according to the invention.

FIG. 1 shows an exemplary embodiment of the calibration system 1 according to the invention. The calibration system 1 according to the invention contains a measuring device 2 and a calibration device 3. The measuring device 2 and the calibration device 3 are connected to one another via a data link 4 and one or more test connections 5. One or more of these connections 4, 5 can be realised via a wireless interface.

The calibration system 1 according to the invention is configured by setting up the connections 4 and 5 for a calibration process. At this time, current calibration parameters are already stored in a calibration-parameter store of the measuring device 2. These calibration parameters are preferably stored in a standardised form. After the connections have been set up, the current calibration parameters are transmitted from the measuring device 2 to the calibration device 3. This can be implemented at the initiative of the measuring device 2 or at the initiative of the calibration device 3. The calibration device 3 stores the calibration parameters of the measuring device 2. A series of calibration measurements is now implemented on the basis of the calibration parameters transmitted. These can include measurements implemented by the measuring device 2 and also by the calibration device 3. A control of the measuring device 2 by the calibration device 3 via the data link 4 is possible. In this context, the control is implemented using a standardised protocol, for example, SCPI.

If the measuring device 2 is, for example, a signal generator, the calibration device 3 instructs the measuring device 2 to generate a series of defined signals and to transmit them via the signal connections 5 to the calibration device 3. The calibration device 3 then measures the signals. By contrast, if the measuring device 2 is, for example, a network analyser, the calibration device 3 simulates a device under test which is then measured by the measuring device 2. Results of these measurements or respectively parameters of this measurement, for example, the duration of a sweep, are then transmitted from the measuring device 2 to the calibration device 3.

In general terms therefore, calibration measurements are carried out by the calibration device 3 and/or the measuring device 2. Results of the calibration measurements from the measuring device 2 are transmitted via the data link 4 to the calibration device 3. The calibration device 3 then compares the results of the calibration measurements with the calibration parameters previously transmitted to the calibration device 3. On the basis of the comparison, the calibration device 3 then determines the capability of the measuring device 2. In this manner, it is possible to determine whether the measuring device 2 observes the standardised calibration parameters.

Figure 2:
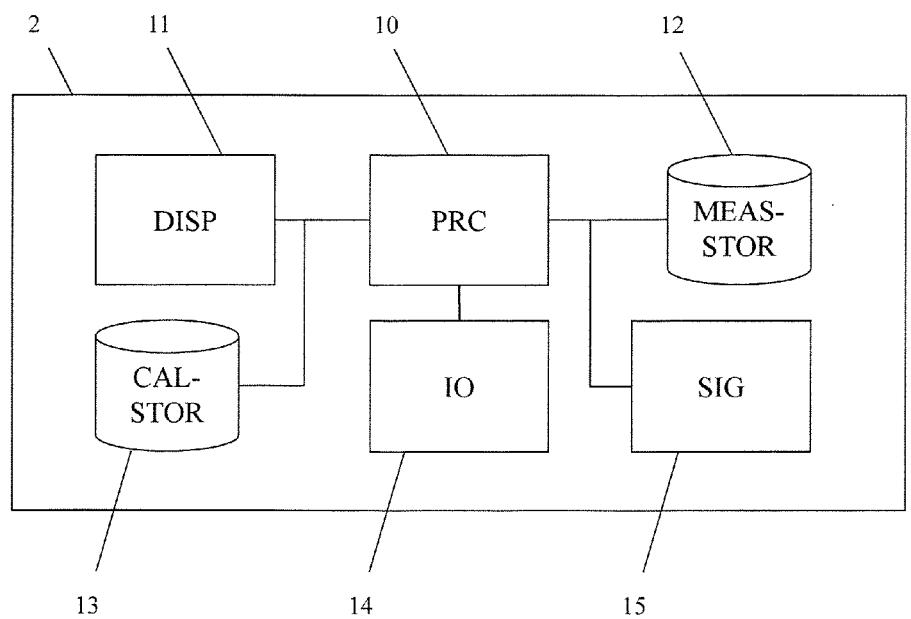
FIG. 2 an exemplary embodiment of the measuring device according to the invention.
Figure 3:
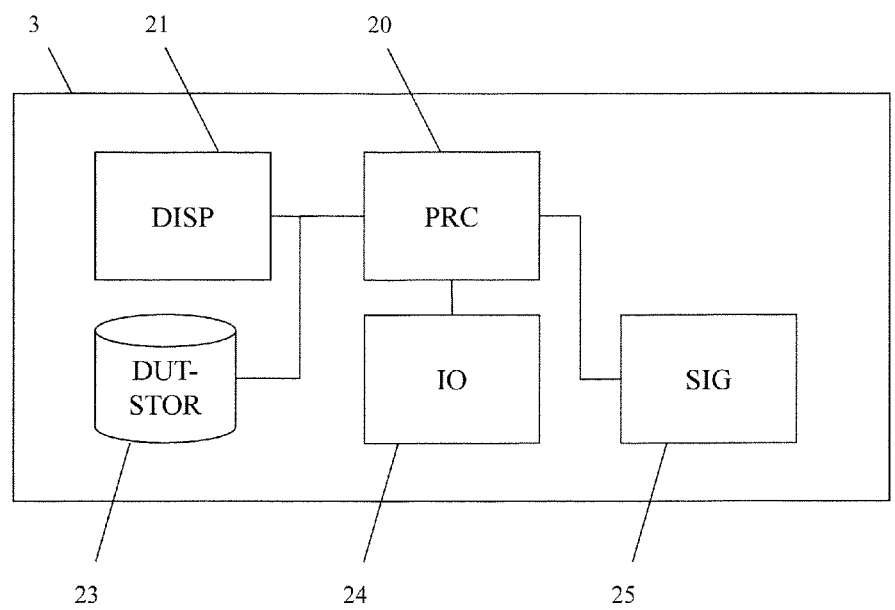
FIG. 3 an exemplary embodiment of the calibration device according to the invention.

FIG. 2 presents an exemplary embodiment of the measuring device according to the invention. The measuring device can be, for example, a signal analyser, a signal generator, a network analyser, a spectrum analyser etc. A measuring device 2 which corresponds to the measuring device 2 from FIG. 1 contains a processor 10, a display device 11, a measured-value memory 12, a calibration-parameter store 13, a communications device 14 and signal-processing device 15. In this context, the processor 10 controls the other components.

Accordingly, the display device 11 is controlled by the processor 10 in such a manner that it can be used to implement a user dialogue. Furthermore, the result of measurements can be displayed by means of the display device 11. With reference to calibration measurements, the result of the capability test can also be displayed here. The measured-value memory 12 is controlled by the processor 10 in such a manner that past measured values can be stored in it and retrieved from it.

The communications device 14 is controlled by the processor 10 in such a manner that it can implement a communication with other devices via a standardised interface. The data link 4 from FIG. 1 is implemented via the communications device 14.

The signal-processing device 15 is controlled by the processor 10 in such a manner that it generates signals dependent upon the function of the measuring device 2 and outputs them at the output, or receives signals and brings them into a form suitable for processing. Both functions can also be performed by the signal-processing device 15. Analog-digital converters, digital-analog converters, mixers etc. form part of the signal-processing device 15.

The calibration-parameter store 13 is also controlled by the control device 10. In this context, the control device 10 stores standardised calibration parameters in the calibration-parameter store 13. The standardised calibration parameters are therefore supplied to the measuring device 2 conventionally via the communications device 14.

In an alternative embodiment, it is also conceivable that the processor 10 automatically recognises that a component of the measuring device 2 has been modified and that the calibration parameters have therefore also changed. In this case, the processor 10 automatically updates the standardised calibration parameters stored in the calibration-parameter store 13 on the basis of the change of the respective component. In the case of a change of the device software, an automatic matching is also conceivable.

Moreover, it is conceivable for the processor 10 to contact an external device automatically, for example, on the basis of a control interval, by means of the communications device 14 and to request calibration parameters which have been updated there. If these are available, they are received by the communications device 14 and stored by the processor 10 in the calibration-parameter store 13. The preparation of the standardised calibration parameters will be described in greater detail with reference to FIG. 4.

FIG. 3 shows an exemplary embodiment of the calibration device according to the invention. The calibration device 3 corresponds to the calibration device 3 from FIG. 1. It contains a processor 20, a display device 21, a communications device 24, a signal-processing device 25 and a device-under-test store 23. In this context, the processing device 20 controls the other components.

Accordingly, the processor 20 controls the display device 21 in such a manner that a user dialogue can be opened via the display device 21. Moreover, it controls the display device 21 in such a manner that the results of a calibration measurement are displayed on the latter.

The communications device 24 is used for communication with external devices via an advantageously standardised interface. For example, SCPI is used. The communication by means of the communications device 24 is also controlled by the processor 20. Accordingly, in the case of a calibration measurement, a connection is set up between a measuring device to be investigated, for example, the measuring device 2 from FIG. 1 and FIG. 2, and the communications device 24. Via the communications device 24, the processor 20 controls the measuring device under investigation.

The DUT store 23 is used for the intermediate storage of calibration parameters of the device under test which is to be measured directly, that is to say, of the measuring device 2 from FIG. 1. Accordingly, by means of the communications device 24, the control device 20 requests the calibration parameters to be used for the measuring device 2. These are transmitted from the measuring device 2 in a standardised form. These standardised calibration parameters are transmitted by the communications device 24 to the processor 20 and stored by the latter in the DUT store 23.

The signal-processing device 25 is used for the reception and transmission of signals for the implementation of the calibration measurement. Conventionally, analog-digital converters, digital-analog converters, mixers etc. form part of the signal-processing device 25. Dependent upon the function of the measuring device under investigation, under the control of the processor 20, the signal-processing device 25 only transmits signals, only receives signals or transmits and receives signals.

In this context, the signal-processing device 25 brings received signals into a form which can be further processed and transmits them to the processor 20. Moreover, the communications device 24 preferably receives from the measuring device under investigation the results from calibration measurements, which have been implemented in the measuring device 2. The processor 20 processes all of these results of the calibration measurements.

After the calibration measurements have been completed, the processing device 20 compares the transmitted, standardised calibration parameters with the measured results and in this manner determines the capability of the device under test just investigated.

To ensure that currently updated, standardised calibration parameters are always used for the calibration measurement, the calibration parameters are updated in the measuring device 2, as soon as the hardware, software or firmware of the measuring device 2 are updated. An update is also conceivable here even if only errors in the original calibration parameters are corrected.

Such an update of the calibration parameters of the measuring device 2 can always be implemented if the measuring device 2 has contact with an external computer, for example, if it is connected to the Internet, or if it is connected to a service computer in the context of a service operation to be implemented.

Figure 4:
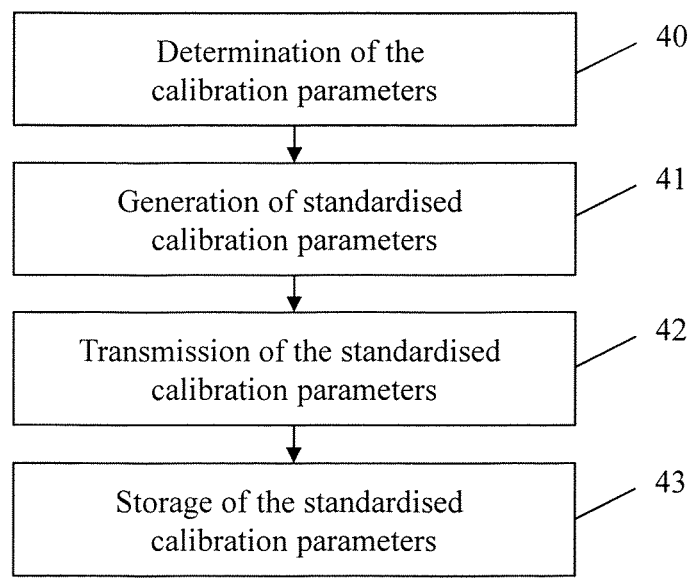
FIG. 4 an exemplary embodiment of the method according to the invention as a block circuit diagram in a first partial view.

FIG. 4 shows an exemplary embodiment of the method according to the invention for operating the calibration system as a block-circuit diagram in a first partial view. In this context, FIG. 4 shows the generation of the standardised calibration parameters in the calibration-parameter store of the measuring device 2. In a first step 40, new calibration parameters are determined in view of a change of the hardware, software or firmware of the measuring device 2 or a simple correction of the calibration parameters. This is implemented either manually by personnel of the manufacturer of the measuring device or automatically by the processor in the measuring device. On the basis of the new calibration parameters determined in this manner, standardised calibration parameters are generated in a second step 41. In this context, the standardised calibration parameters are provided in a standardised format. That is to say, they are readily machine-readable.

In a third step 42, the standardised calibration parameters obtained in this manner are transmitted to the measuring device 2 from FIG. 1. In a fourth step 43, the standardised calibration parameters are stored in the calibration-parameter store of the measuring device.

For every change of the hardware, software or firmware and every correction of the calibration parameters of the measuring device, the steps just described are run through again. That is to say, as soon as the currently stored calibration parameters no longer match the present configuration of the measuring device, they are renewed by running through the steps named above.

Figure 5:
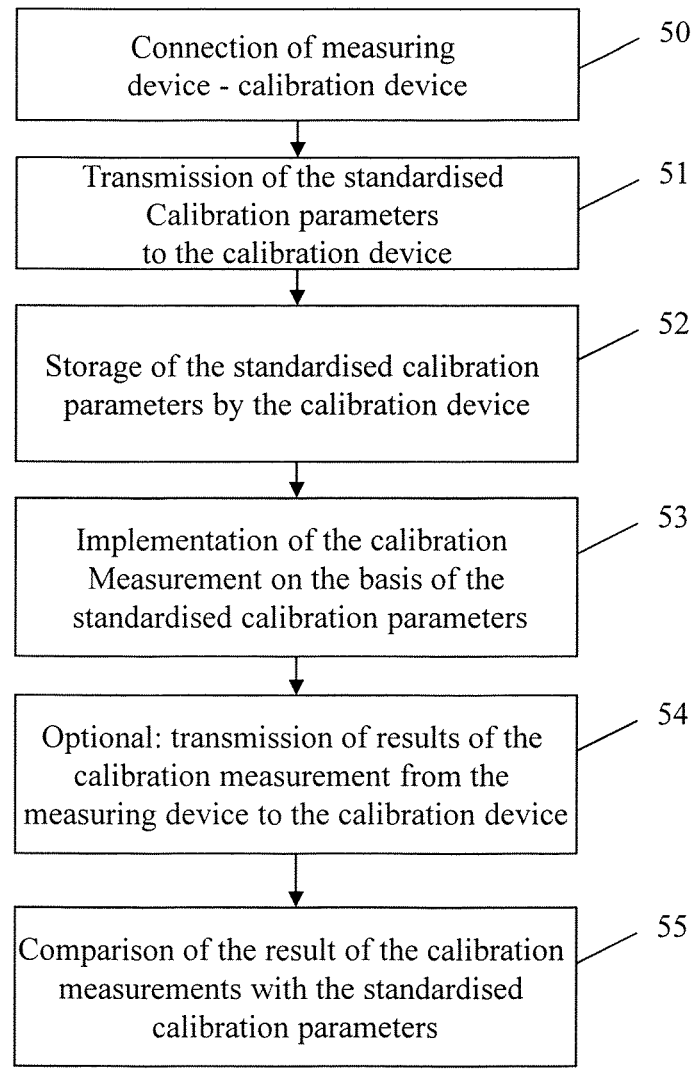
FIG. 5 the exemplary embodiment of the method according to the invention as a block circuit diagram in a second partial view.

FIG. 5 shows a second partial view of the exemplary embodiment of the method according to the invention for operating the calibration system. Here, the implementation of a calibration measurement is shown. In a first step 50, a connection is set up between the measuring device under investigation and a calibration device. In this context, the connection is provided at least as a data link. In addition to this, a connection of measurement lines is also possible as an option. Each of these connections can then optionally be realised by a wireless connection.

In a second step 51, standardised calibration parameters stored in the measuring device are transmitted to the calibration device. This transmission is implemented either at the initiative of the measuring device or at the initiative of the calibration device. Optionally, the measuring device and the calibration device communicate via a standardised interface which uses a standardised protocol, for example SCPI. Upon completion of the transmission of the standardised calibration parameters, these are stored, in a third step 52, by the calibration device in a DUT store. In a fourth step 53, the stored, standardised calibration parameters are used to implement calibration measurements. That is, calibration measurements of this kind are implemented in order to check all of the calibration parameters transmitted.

In a fifth step 54, results of calibration measurements which have been implemented by the measuring device itself are then transmitted to the calibration device. Such a step is necessary especially in the case of measuring devices which measure externally supplied signals.

In a final sixth step 55, the results of the calibration measurements investigated in this manner are compared with the stored, transmitted, standardised calibration parameters. The capability of the measuring device just measured is determined on the basis of this comparison. A classification of restricted capability is accordingly possible.

The invention is not restricted to the exemplary embodiment presented. As already mentioned, an arbitrary number of different measuring devices, for example, signal generators, oscilloscopes, spectrum analysers, network analysers etc. can be used. All of the features described above or illustrated in the drawings can be advantageously combined with one another as required within the scope of the invention.

We claim:

1. A measuring system comprising:
a measuring device and a separate calibration device, wherein:
the measuring device comprises a signal-processing device, a processor for controlling the measuring device and a communications device,
the signal-processing device of the measuring device and the communications device of the device are each connected to the processor of the measuring device,
the measuring device comprises a calibration-parameter store connected to the processor of the measuring device for the storage of calibration parameters,
the processor of the measuring device is embodied to communicate calibration parameters, which are stored in the calibration-parameter store, to the calibration device using the communications device of the measuring device and to implement calibration measurements using the signal-processing device of the measuring device,
the calibration device comprises a signal-processing device, a communications device, a processor for controlling the calibration device, and a DUT store,
the DUT store, the signal-processing device of the measuring device and the communications device of the measuring device are connected to the processor of the measuring device, and
the processor of the measuring device is embodied to receive calibration parameters from the measuring device to be calibrated using the communications device of the calibration device and to store them in the DUT store, and, using the signal-processing of the calibration device, to implement calibration measurements on the measuring device on the basis of the calibration parameters.

2. The measuring system according to claim 1, wherein the measuring device is connected to the calibration device using the signal-processing device of the measuring device and using the communications device of the measuring device.

3. The measuring system according to claim 1, wherein the processor of the measuring device transmits results of the calibration measurements to the calibration device using the communications device of the measuring device.

4. The measuring system according to claim 1, wherein the communications device of the measuring device is embodied to communicate with the calibration device using a standardized protocol, and wherein the measuring device is embodied to be controlled from the calibration device using the standardized protocol.

5. The measuring system according to claim 4, wherein the standardized protocol comprises SCPI.

6. The measuring system according to claim 1, wherein the measuring device is embodied to generate the calibration parameters automatically on the basis of a device hardware, a device software and/or a device firmware.

7. The measuring system according to claim 1, wherein the processor of the calibration device is embodied to implement calibration measurements on the measuring device on the basis of the calibration parameters, and/or to receive results from calibration measurements, which have been implemented by the measuring device to be calibrated, using the communications device of the calibration device.

8. The measuring system according to claim 1, wherein the processor of the calibration device is embodied to implement a comparison of results of the calibration measurements with the calibration parameters, and to determine on the basis of the comparison a capability of the measuring device to be calibrated.

9. The measuring system according to claim 1, wherein the communications device of the calibration device is embodied to communicate with the measuring device to be calibrated using a standardized protocol, and wherein the processor of the calibration device is embodied to control the measuring device to be calibrated using the standardized protocol using the communications device of the calibration device.

10. The measuring system according to claim 9, wherein the standardized protocol comprises SCPI.

11. A method for operating the measuring system according to claim 1, comprising the steps of:
reading by the calibration device of calibration parameters of the measuring device from the calibration-parameter store of the measuring device;
implementation of calibration measurements on the basis of the calibration parameters read by the measuring device and/or the calibration device; and
determination of the capability of the measuring device on the basis of a comparison of results of the calibration measurements and the calibration parameters.

12. The method according to claim 11, further comprising the steps following performed before the reading of the calibration parameters:
determination of calibration parameters;
transmission of the calibration parameters to the measuring device, and
storage of the calibration parameters by the measuring device.

13. The method according to claim 11, whereby the calibration parameters are generated automatically on the basis of a device hardware and/or a device software and/or a device firmware.

14. The method according to claim 11, whereby the calibration parameters are generated in a standardized form or converted into a standardized form after they have been generated.

* * * * *